(12) United States Patent  (10) Patent No.: US 8,319,242 B2
Shiobara et al.  (45) Date of Patent: Nov. 27, 2012

(54) LIGHT-EMITTING SEMICONDUCTOR DEVICE, MOUNTED SUBSTRATE, AND FABRICATION METHOD THEREOF

(75) Inventors: Toshio Shiobara, Chiyoda-ku (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/179,200

(22) Filed: Jul. 8, 2011

(65) Prior Publication Data

US 2012/0007119 A1 Jan. 12, 2012

(30) Foreign Application Priority Data

Jul. 8, 2010 (JP) ................... 2010-155362

(51) Int. Cl.
*H01L 33/00* (2010.01)
(52) U.S. Cl. ............. 257/98; 257/97; 257/E33.061; 257/E23.12; 257/791; 438/106; 438/107; 438/123
(58) Field of Classification Search ............ 257/91–98, 257/E33.061, E23.12, 791; 438/106–123
See application file for complete search history.

(56) References Cited

U.S. PATENT DOCUMENTS

| | | | | | |
|---|---|---|---|---|---|
| 5,221,642 | A * | 6/1993 | Burns | ............ | 156/233 |
| 5,492,981 | A | 2/1996 | Hoehn et al. | | |
| 5,847,507 | A * | 12/1998 | Butterworth et al. | ......... | 313/512 |
| 6,383,641 | B1 * | 5/2002 | Kondou et al. | ............. | 428/412 |
| 6,417,019 | B1 * | 7/2002 | Mueller et al. | ................ | 438/29 |
| 6,586,874 | B1 * | 7/2003 | Komoto et al. | ............. | 313/503 |
| 6,710,377 | B2 | 3/2004 | Shimomura | | |
| 6,747,293 | B2 * | 6/2004 | Nitta et al. | ...................... | 257/99 |
| 7,157,745 | B2 * | 1/2007 | Blonder et al. | ................. | 257/98 |
| 7,594,840 | B2 * | 9/2009 | Sorg | ............................... | 445/25 |
| 7,714,347 | B2 * | 5/2010 | Chen et al. | ..................... | 257/99 |
| 7,964,887 | B2 * | 6/2011 | Ohba | .............................. | 257/98 |
| 7,982,384 | B2 * | 7/2011 | Komoto et al. | ............... | 313/501 |
| 8,035,125 | B2 * | 10/2011 | Abe | ................................ | 257/99 |
| 8,084,530 | B2 * | 12/2011 | Tanikawa et al. | ............ | 524/442 |
| 2002/0113241 | A1 * | 8/2002 | Kubota et al. | ................... | 257/79 |
| 2002/0167062 | A1 * | 11/2002 | Narita | ........................... | 257/433 |
| 2002/0190266 | A1 * | 12/2002 | Kanatake | ...................... | 257/112 |
| 2004/0217369 | A1 * | 11/2004 | Nitta et al. | ..................... | 257/99 |
| 2007/0126129 | A1 * | 6/2007 | Ahn et al. | ..................... | 257/783 |
| 2009/0010017 | A1 * | 1/2009 | Hayashi et al. | ............... | 362/516 |
| 2009/0091045 | A1 * | 4/2009 | Tanikawa et al. | ............. | 257/791 |
| 2009/0230409 | A1 * | 9/2009 | Basin et al. | ..................... | 257/88 |
| 2010/0006819 | A1 * | 1/2010 | Shimizu et al. | ................. | 257/13 |
| 2010/0140638 | A1 * | 6/2010 | Kotani et al. | ................... | 257/98 |

FOREIGN PATENT DOCUMENTS

JP 7-97433 4/1995

(Continued)

*Primary Examiner* — N Drew Richards
*Assistant Examiner* — Ankush Singal
(74) *Attorney, Agent, or Firm* — Oblon, Spivak, McClelland, Maier & Neustadt, L.L.P.

(57) ABSTRACT

A light-emitting semiconductor device includes a lead frame having lead electrodes, a reflector arranged with the lead frame, and a light-emitting semiconductor chip accommodated in the reflector and having electrodes connected to the lead electrodes by a flip-chip bonding method, wherein: a gap between the lead frame and the light-emitting semiconductor chip is filled with a cured underfill material, and a cured silicon oxide film of 0.05 to 10 μm thickness is formed covering surfaces of the light-emitting semiconductor chip and reflector.

26 Claims, 4 Drawing Sheets

FOREIGN PATENT DOCUMENTS

| | | |
|---|---|---|
| JP | 2002-314139 | 10/2002 |
| JP | 2002-314143 | 10/2002 |
| JP | 2004-99751 | 4/2004 |
| JP | 2005-263869 | 9/2005 |
| JP | 2008-10591 | 1/2008 |
| JP | 2009-33107 | 2/2009 |

* cited by examiner

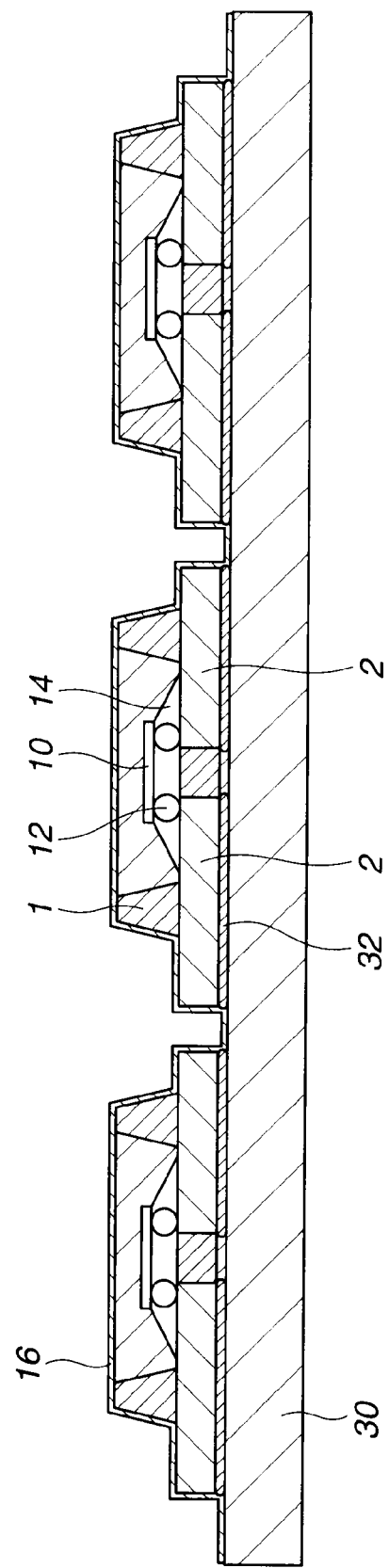

LIGHT-EMITTING SEMICONDUCTOR DEVICE, MOUNTED SUBSTRATE, AND FABRICATION METHOD THEREOF

CROSS-REFERENCE TO RELATED APPLICATION

This non-provisional application claims priority under 35 U.S.C. §119(a) on Patent Application No. 2010-155362 filed in Japan on Jul. 8, 2010, the entire contents of which are hereby incorporated by reference.

TECHNICAL FIELD

This invention relates to a light-emitting semiconductor device which, owing to significant improvements in gas transmission resistance, can avoid a reduction in brightness associated with a decrease in the reflectance of a reflector and also corrosion due to penetration of corrosive gas, and therefore, can assure long-term reliability. This invention also relates to a fabrication method of the light-emitting semiconductor device, a mounted substrate with the light-emitting semiconductor device mounted thereon, and a fabrication method of the mounted substrate.

BACKGROUND ART

Epoxy resin compositions and silicone resin compositions have heretofore been widely used to encapsulate light-emitting semiconductor chips. In general, resin compositions of these types are poured into molds in which light-emitting semiconductor chips are arranged by casting, transfer molding or the like, and are then cured to encapsulate the light-emitting semiconductor chips.

Keeping in step with the adoption of LEDs with higher brightness and higher power in recent years, the problem of discoloration and degradation of epoxy resins has arisen. In particular, transparent epoxy resins undergo yellowing by blue light and ultraviolet rays, and therefore, are accompanied by the problem that they reduce the service life of chips.

Proposed in JP-A 2008-10591 (Patent Document 1) is a light-emitting device capable of avoiding sulfidation of a silver-plated surface by coating the silver-plated surface with a thin film of a resin having low $H_2S$ transmission property. An organic resin, however, involves a problem in that it is weak against light and heat and is inferior in long-term reliability. Proposed in JP-A 2009-33107 (Patent Document 2), on the other hand, is a light-emitting device with a metallic reflection member coated with a film of a glass that contains Si—N bonds as an essential feature. However, the glass with Si—N bonds contained therein has not been allowed to react completely, and therefore is unstable. As a result of changes with time through hydrolysis or the like, the glass film is lowered in flexibility to form microcracks, leading to problems that damages to the package may be caused or the gas barrier properties of the glass film may be lowered.

With a view to overcoming the above-described problems, silicone resins excellent in both heat resistance and light resistance have been finding utility. These silicone resins are, however, accompanied by problems that in cured forms, they have higher gas transmission property and lower strength than epoxy resins. Accordingly, those making use of high-hardness rubbery silicone resins for encapsulating purpose have been proposed (JP-A 2002-314139 (Patent Document 3) and JP-A 2002-314143 (Patent Document 4)).

However, these high-hardness rubbery silicone resins are low in adhesive properties, and therefore, involve a problem in that, in encased light-emitting semiconductor devices, i.e., devices with light-emitting chips being arranged in ceramic and/or plastic casings and with the casings being internally filled up with the silicone resins, the silicone resins separate from the ceramics or plastics of the casings in thermal shock tests at from −40 to 120° C.

Even with such high-hardness rubbery silicone resins, the gas transmission property is higher compared with that of epoxy resins and the like, so that corrosive gas such as nitrogen oxides and sulfur oxides transmits through the silicone resins and reacts with the silver-plated parts of reflector surfaces. As a consequence, such high-hardness rubbery silicone resins become a cause of a reduction in photoreflectance, and hence, a reduction in brightness.

In the meantime, an epoxy-containing silicone resin has been proposed to provide increased thermal shock resistance (JP-A H7-97433 (Patent Document 5)). However, this silicone resin is synthesized by subjecting an epoxy-containing silane and a silanol to condensation, and its cured product is low in modulus of elasticity and is brittle. Therefore, an LED molded in a resin of this type is accompanied by a problem that the resin is prone to cracking in a temperature cycling test.

As solutions to the above-described problem, there are known a composition that contains an epoxy resin and a silsesquioxane containing at least two epoxy rings (JP-A 2005-263869 (Patent Document 6)) and a composition that contains an epoxy resin and a silicone resin containing groups of an isocyanuric acid derivative (JP-A 2004-99751 (Patent Document 7)). Neither of these composition are, however, considered to exhibit any satisfactory anti-cracking properties in temperature cycling tests of their cured products.

SUMMARY OF THE INVENTION

An object of the present invention is to provide a light-emitting semiconductor device capable of preventing a reduction in brightness and corrosion, which are associated with a reduction in the reflectance of a reflector and is caused by penetration of corrosive gas, respectively, and hence assuring long-term reliability by significantly improving the gas transmission resistance. Another object of the present invention is to provide a fabrication method of the light-emitting semiconductor device, a mounted substrate with the light-emitting semiconductor device, and a fabrication method of the mounted substrate.

The present inventors have enthusiastically performed research to achieve the above-described objects. As a result, it has been found that the coating of surfaces of a light-emitting semiconductor chip, a reflector and thin conductive wires or a resin encapsulating the chip, reflector and wires with a cured silicon oxide film formed by curing perhydropolysilazane makes it possible to provide the resulting light-emitting semiconductor device with pronouncedly improved gas transmission resistance, leading to the completion of the present invention.

The present invention, therefore, provides the following light-emitting semiconductor device provided with improved gas transmission resistance, a mounted substrate with the light-emitting semiconductor device, and their fabrication methods.

[1] A light-emitting semiconductor device comprising a lead frame having lead electrodes, a reflector arranged with the lead frame, and a light-emitting semiconductor chip accommodated in the reflector and having electrodes connected to the lead electrodes by a flip-chip bonding method, wherein:
a gap between the lead frame and the light-emitting semiconductor chip is filled with a cured underfill material, and
a cured silicon oxide film of 0.05 to 10 µm thickness is formed covering surfaces of the light-emitting semiconductor chip and reflector.

[2] The light-emitting semiconductor device according to [1], wherein the light-emitting semiconductor chip is encapsulated in a transparent resin or a phosphor-containing transparent resin.

[3] A light-emitting semiconductor device comprising a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires, wherein:
a cured silicon oxide film of 0.05 to 10 µm thickness is formed covering surfaces of the light-emitting semiconductor chip, thin conductive wires and reflector.

[4] The light-emitting semiconductor device according to [3], wherein the light-emitting semiconductor chip is encapsulated in a transparent resin or a phosphor-containing transparent resin.

[5] A light-emitting semiconductor device comprising a lead frame having lead electrodes, a reflector arranged with the lead frame, and a light-emitting semiconductor chip accommodated in the reflector and having electrodes connected to the lead electrodes by a flip-chip bonding method,
wherein:
a gap between the lead frame and the light-emitting semiconductor chip is filled up with a cured underfill material,
the light-emitting semiconductor chip is encapsulated in a transparent resin or a phosphor-containing transparent resin, and
a cured silicon oxide film of 0.05 to 10 µm thickness is formed covering surfaces of the transparent resin and reflector.

[6] A light-emitting semiconductor device comprising a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires,
wherein:
the light-emitting semiconductor chip and thin conductive wires are encapsulated in a transparent resin or a phosphor-containing transparent resin, and
a cured silicon oxide film of 0.05 to 10 µm thickness is formed covering surfaces of the transparent resin and reflector.

[7] The light-emitting semiconductor device according to any one of [2], [4], [5] and [6], wherein the transparent resin contains at least 30 wt % of a silicone resin.

[8] The light-emitting semiconductor device according to [7], wherein the transparent resin is a cured product of a thermosetting epoxy-silicone resin composition.

[9] The light-emitting semiconductor device according to any one of [1], [3], [5] and [6], wherein the cured silicon oxide film has been formed by curing perhydropolysilazane.

[10] A mounted substrate comprising a mounting substrate and a light-emitting semiconductor device mounted on the mounting substrate, said light-emitting semiconductor device being provided with a lead frame having lead electrodes, a reflector arranged with the lead frame, and a light-emitting semiconductor chip accommodated in the reflector and having electrodes connected to the lead electrodes by a flip-chip bonding method, and said light-emitting semiconductor device having been mounted on the mounting substrate by bonding the lead electrodes to the mounting substrate with a conductive bonding material,
wherein:
a gap between the lead frame and the light-emitting semiconductor chip is filled up with a cured underfill material,
the light-emitting semiconductor chip is encapsulated in a transparent resin or a phosphor-containing transparent resin, and
a cured silicon oxide film of 0.05 to 10 µm thickness is formed over a surface of the light-emitting semiconductor device on the mounting substrate.

[11] A mounted substrate comprising a mounting substrate and a light-emitting semiconductor device mounted on the mounting substrate, said light-emitting semiconductor device being provided with a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires, and said light-emitting semiconductor device having been mounted on the mounting substrate by bonding the lead electrodes to the mounting substrate with a conductive bonding material,
wherein:
the light-emitting semiconductor chip and thin conductive wires are encapsulated in a transparent resin or a phosphor-containing transparent resin, and
a cured silicon oxide film of 0.05 to 10 µm thickness is formed over a surface of the light-emitting semiconductor device on the mounting substrate.

[12] The mounted substrate according to [10] or [11], wherein the transparent resin contains at least 30 wt % of a silicone resin.

[13] The mounted substrate according to [12], wherein the transparent resin is a cured product of a thermosetting epoxy-silicone resin composition.

[14] The mounted substrate according to [10] or [11], wherein the cured silicon oxide film has been formed by curing perhydropolysilazane.

[15] A fabrication method of a light-emitting semiconductor device provided with a lead frame having lead electrodes, a reflector arranged with the lead frame, and a light-emitting semiconductor chip having electrodes and accommodated in the reflector, which comprises:
connecting the electrodes of the light-emitting semiconductor chip to the lead electrodes by a flip-chip bonding method,
filling a gap between the lead frame and the light-emitting semiconductor chip with an underfill material, and then curing the underfill material, and then,
spray- or cast-coating a solution of perhydropolysilazane to cover surfaces of the light-emitting semiconductor chip and reflector, and then curing the perhydropolysilazane to form a cured silicon oxide film of 0.05 to 10 µm thickness.

[16] The fabrication method according to [15], further comprising:
encapsulating the light-emitting semiconductor chip with a transparent resin or a phosphor-containing transparent resin.

[17] A fabrication method of a light-emitting semiconductor device provided with a lead frame having a die pad and lead electrodes, a reflector arranged with the lead frame, and a light-emitting semiconductor chip having electrodes, accommodated in the reflector and fixed on the die pad with a die bonding material, which comprises:

connecting the electrodes of the light-emitting semiconductor chip and the lead electrodes together via thin conductive wires, and then, spray- or cast-coating a solution of perhydropolysilazane to cover surfaces of the light-emitting semiconductor chip, thin conductive wires and reflector, and then curing the perhydropolysilazane to form a cured silicon oxide film of 0.05 to 10 µm thickness.

[18] The fabrication method according to [17], further comprising:

encapsulating the light-emitting semiconductor chip with a transparent resin or a phosphor-containing transparent resin.

[19] A fabrication method of a light-emitting semiconductor device provided with a lead frame having lead electrodes, a reflector arranged with the lead frame, and a light-emitting semiconductor chip having electrodes and accommodated in the reflector, which comprises:

connecting the electrodes of the light-emitting semiconductor chip to the lead electrodes by a flip-chip bonding method, filling a gap between the lead frame and the light-emitting semiconductor chip with an underfill material, and then curing the underfill material, encapsulating the light-emitting semiconductor chip with a transparent resin or a phosphor-containing transparent resin, and then, spray- or cast-coating a solution of perhydropolysilazane to cover surfaces of the transparent resin and reflector, and then curing the perhydropolysilazane to form a cured silicon oxide film of 0.05 to 10 µm thickness.

[20] A fabrication method of a light-emitting semiconductor device provided with a lead frame having a die pad and lead electrodes, a reflector arranged with the lead frame, and a light-emitting semiconductor chip having electrodes, accommodated in the reflector and fixed on the die pad with a die bonding material, which comprises:

connecting the electrodes of the light-emitting semiconductor chip and the lead electrodes together via thin conductive wires, encapsulating the light-emitting semiconductor chip and thin conductive wires with a transparent resin or a phosphor-containing transparent resin, and then, spray- or cast-coating a solution of perhydropolysilazane to cover surfaces of the transparent resin and reflector, and then curing the perhydropolysilazane to form a cured silicon oxide film of 0.05 to 10 µm thickness.

[21] The fabrication method according to any one of [16], [18], [19] and [20], wherein the transparent resin contains at least 30 wt % of a silicone resin.

[22] The fabrication method according to [21], wherein the transparent resin is a cured product of a thermosetting epoxy-silicone resin composition.

[23] A fabrication method of a mounted substrate including a mounting substrate and a light-emitting semiconductor device mounted on the mounting substrate and provided with a lead frame having lead electrodes, a reflector arranged with the lead frame, and a light-emitting semiconductor chip having electrodes and accommodated in the reflector, which comprises:

connecting the electrodes of the light-emitting semiconductor chip to the lead electrodes by a flip-chip bonding method, filling a gap between the lead frame and the light-emitting semiconductor chip with an underfill material, and then curing the underfill material, encapsulating the light-emitting semiconductor chip with a transparent resin or a phosphor-containing transparent resin, bonding the lead electrodes to the mounting substrate with a conductive bonding material to mount the light emitting semiconductor device on the mounting substrate, and then, spray- or cast-coating a solution of perhydropolysilazane to cover a surface of the light-emitting semiconductor device on the mounting substrate, and then curing the perhydropolysilazane to form a cured silicon oxide film of 0.05 to 10 µm thickness.

[24] A fabrication method of a mounted substrate including a mounting substrate and a light-emitting semiconductor device mounted on the mounting substrate and provided with a lead frame having a die pad and lead electrodes, a reflector arranged with the lead frame, and a light-emitting semiconductor chip having electrodes, accommodated in the reflector and fixed on the die pad with a die bonding material, which comprises:

connecting the electrodes of the light-emitting semiconductor chip and the lead electrodes together via thin conductive wires, encapsulating the light-emitting semiconductor chip and thin conductive wires with a transparent resin or a phosphor-containing transparent resin, bonding the lead electrodes to the mounting substrate with a conductive bonding material to mount the light emitting semiconductor device on the mounting substrate, and then, spray- or cast-coating a solution of perhydropolysilazane to cover a surface of the light-emitting semiconductor device on the mounting substrate, and then curing the perhydropolysilazane to form a cured silicon oxide film of 0.05 to 10 µm thickness.

[25] The fabrication method according to [23] or [24], wherein the transparent resin contains at least 30 wt % of a silicone resin.

[26] The fabrication method according to [25], wherein the transparent resin is a cured product of a thermosetting epoxy-silicone resin composition.

ADVANTAGEOUS EFFECTS OF THE INVENTION

According to the present invention, it is possible to prevent a reduction in the reflectance of a reflector and corrosion, which may occur as a result of penetration of corrosive gas, by significantly improving the gas transmission resistance, and hence to provide a light-emitting semiconductor device capable of assuring long-term reliability.

BRIEF DESCRIPTION OF THE DRAWINGS

FIGS. 1A and 1B show the structure of a representative reflector, in which FIG. 1A is a cross-sectional view taken in the direction of arrows IA-IA of FIG. 1B, and FIG. 1B is a plan view;

FIG. 9 is a cross-sectional view of an illustrative mounted substrate with light-emitting semiconductor devices, in which perhydropolysilazane has been coated and cured subsequent to mounting of the light-emitting semiconductor devices on a mounting substrate.

DESCRIPTION OF THE EMBODIMENTS

The light-emitting semiconductor devices according to the present invention each have a reflector, a light-emitting semiconductor chip, and a metallic lead frame.

The metallic lead frame has a die pad for fixing the light-emitting semiconductor chip thereon and lead electrodes for connecting electrodes of the light-emitting semiconductor chip and external electrodes together. The reflector is in a planar form that a space between the reflector and the lead electrodes is filled up with an organic resin, or in a recessed form that a surface of the die pad and tip surface portions of the lead electrodes form an exposed bottom surface.

Figure 1A:
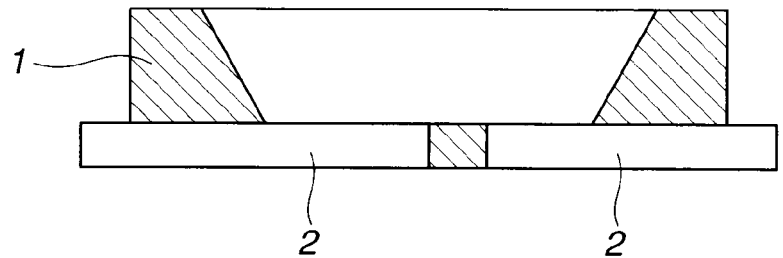
Figure 1B:
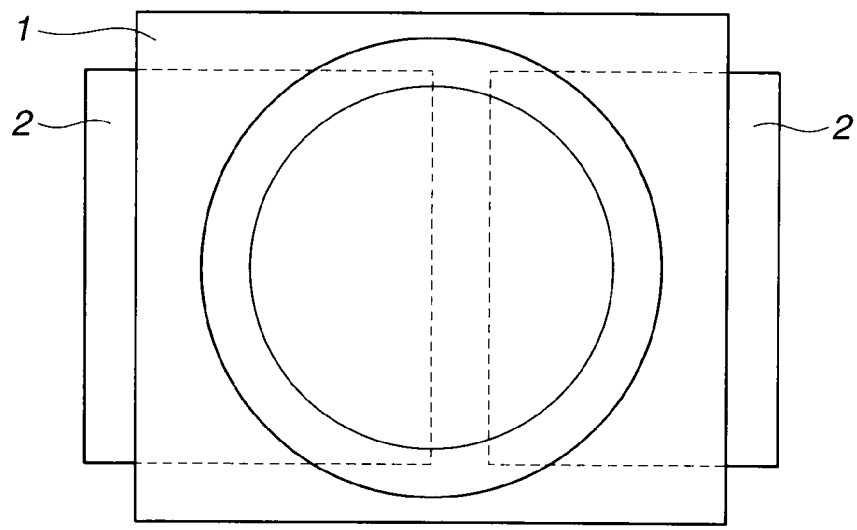

The lead frame is typically the one shown in FIGS. 1A and 1B, which is generally a copper lead frame plated at surfaces thereof with silver and encapsulated in PPA (polyphthalamide) resin. To provide high photoreflectance, the reflector is also plated with silver at its bottom wall and side wall. In FIGS. 1A and 1B, numeral 1 designates the reflector and numeral 2 indicates the lead frame.

Using a reflector of the above-described type, a light-emitting semiconductor chip such as a blue LED is bonded on a die pad of the reflector with a metal or resin die bonding material. Recently, a method is also often adopted, in which solder balls, gold bumps or the like are attached to an LED chip by a flip-chip bonding method and the chip is bonded to a pad and lead electrodes via the solder balls, gold bumps or the like.

Figure 2:
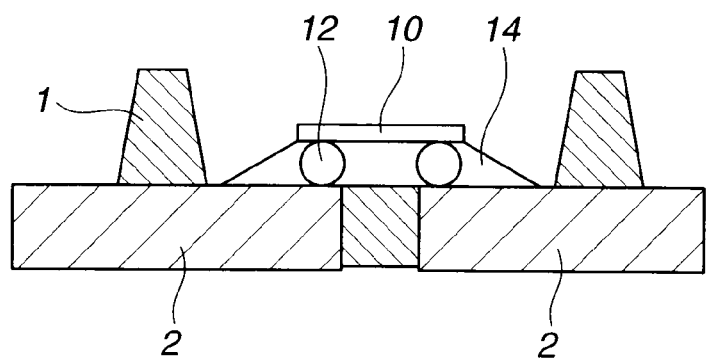
FIG. 2 is a cross-sectional view of an illustrative light-emitting semiconductor device with a light-emitting semiconductor chip bonded on a lead frame by a flip-chip bonding method.

FIG. 2 shows an illustrative light-emitting semiconductor device fabricated by the above-described flip-chip bonding method, to which the present invention can be applied. By the flip-chip bonding method, electrodes of a light-emitting semiconductor chip 10, which is accommodated in the reflector 1 shown in FIGS. 1A and 1B, and lead electrodes of the lead frame 2 are connected together via balls 12 of solder, gold, gold/tin or other metal, so that the light-emitting semiconductor chip 10 is bonded to the lead frame 2. After the bonding, a silicone-based or epoxy resin-based underfill material 14 is caused to penetrate into a gap underneath the light-emitting semiconductor chip 10 to fill up the gap, and is then cured by heat (FIG. 2).

After the underfill material has been cured, a perhydropolysilazane solution is spray- or cast-coated to cover surfaces of the light-emitting semiconductor chip 10 and reflector 1. Subsequently, evaporation of a solvent and an oxidative curing reaction are conducted at a temperature of 180 to 250° C. to form a cured silicon oxide film 16. The thickness of the film 16 is 0.05 to 10 µm, with 0.1 to 5 µm being desired (FIG. 3).

Figure 3:
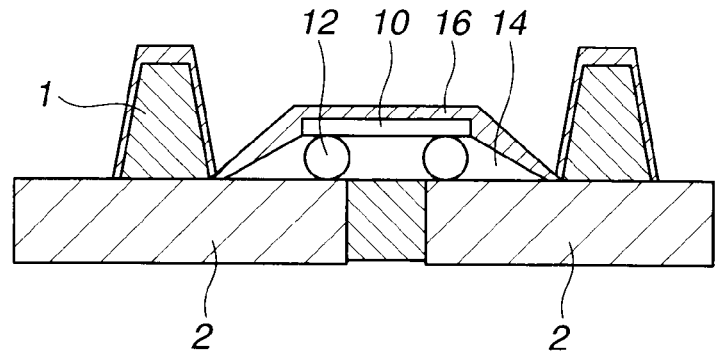
FIG. 3 is a cross-sectional view of a light-emitting semiconductor device according to a first embodiment of the present invention, in which a cured silicon oxide film has been formed by coating perhydropolysilazane.

The light-emitting semiconductor device according to the first embodiment of the present invention, which is shown in FIG. 3, does not require to cast a transparent resin into a recessed part of the reflector 1. As no transparent resin exists on the light-emitting semiconductor chip in this light-emitting semiconductor device, this structure is very beneficial for use with a light-emitting semiconductor chip that emits light in the near infrared range.

When desired to use a blue LED and to convert its emission into light of a white color, it is necessary to bond a phosphor-containing silicone sheet or a phosphor-containing ceramic substrate on a surface of the light-emitting chip and then to coat the phosphor-containing silicone sheet or ceramic substrate with perhydropolysilazane.

Figure 4:
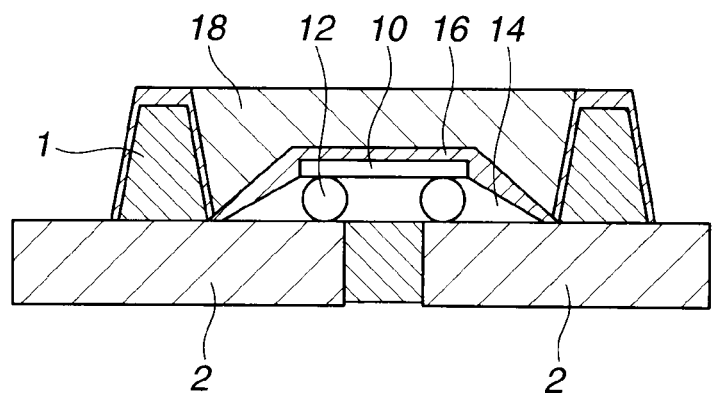
FIG. 4 is a cross-sectional view of a light-emitting semiconductor device according to a second embodiment of the present invention, in which a transparent molding material has been cast and cured in a recessed part of a reflector.

By casting a transparent resin or phosphor-containing transparent resin 18 into the recessed part after the fabrication of the light-emitting semiconductor device of FIG. 3, and further, by curing the transparent resin or phosphor-containing transparent resin 18, the light-emitting semiconductor device according to the second embodiment of the present invention can be fabricated as shown in FIG. 4. When the transparent resin 18 is an addition-curable silicone resin composition, for example, its curing at a temperature of 100 to 150° C. for 30 minutes to two hours makes it possible to provide the light-emitting semiconductor device with excellent reliability.

Figure 5:
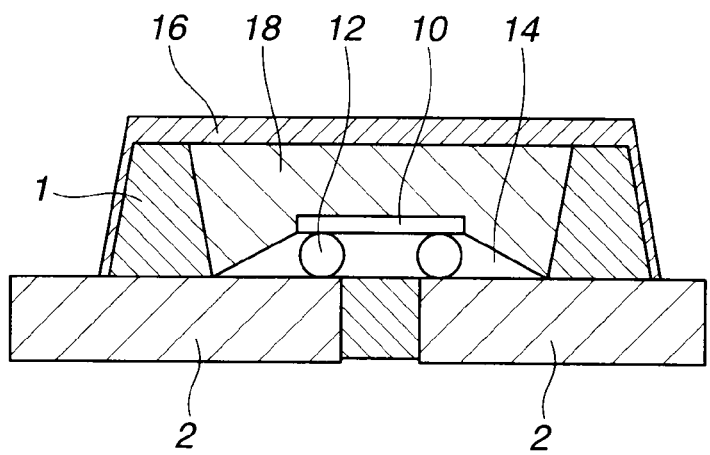
FIG. 5 is a cross-sectional view of a light-emitting semiconductor device according to a third embodiment of the present invention, in which perhydropolysilazane has been coated and cured subsequent to the casting and curing of a transparent molding material in a recessed part of a reflector.

As a light-emitting semiconductor device that can be fabricated by a different fabrication method, the light-emitting semiconductor device of FIG. 5 according to the third embodiment of the present invention can be exemplified. This fabrication method includes bonding the light-emitting semiconductor chip 10 to the lead frame 2 of the reflector 1 by the flip-chip bonding method as shown in FIG. 2, and then casting a transparent resin 18, which is of the same type as that used in FIG. 4, into the recessed part of the reflector and curing the transparent resin 18, as in FIG. 4. After the curing of the transparent resin 18, perhydropolysilazane or its solution is applied onto surfaces of the transparent resin 18 and reflector 1 by a coating method such as spray coating or brush coating, and the perhydropolysilazane is then cured by heat, moisture or the like to form a film 16 of silicon oxide on the surfaces of the transparent resin 18 and reflector 1 (FIG. 5).

Figure 6:
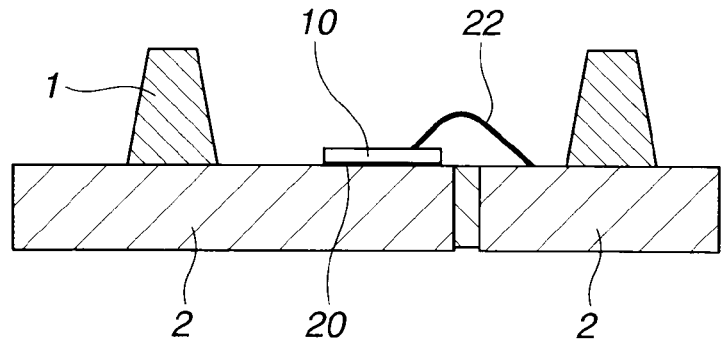
FIG. 6 is a cross-sectional view of another illustrative light-emitting semiconductor device in which electrodes of a light-emitting semiconductor chip and lead electrodes are connected together via gold wires.

FIG. 6 shows another illustrative light-emitting semiconductor device to which the present invention can be applied. Different from the flip-chip bonding method, the electrodes of the light-emitting semiconductor chip and the lead electrodes are connected together via thin conductive wires such as gold wires. Described specifically, the light-emitting semiconductor chip 10 is bonded and fixed on a die pad 20 of a lead frame 2 with a thermosetting, epoxy resin-based die bonding material, a silicone-based die bonding material or the like. Subsequently, the electrodes of the light-emitting semiconductor chip 10 and the lead electrodes are connected together for electrical conduction via gold wires 22 (FIG. 6).

Figure 7:
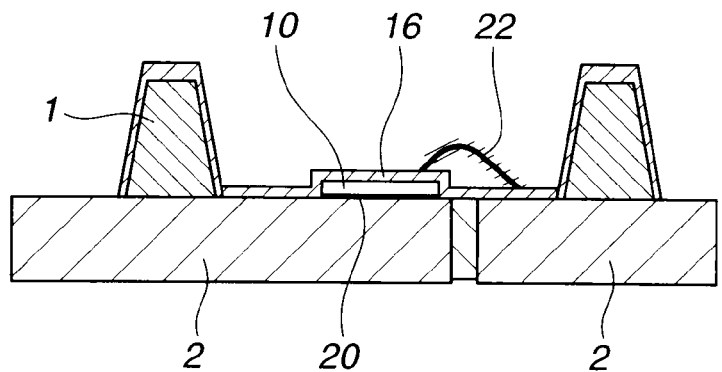
FIG. 7 is a cross-sectional view of a light-emitting semiconductor device according to a fourth embodiment of the present invention, in which perhydropolysilazane has been coated and cured subsequent to the connection of electrodes of a light-emitting semiconductor chip and lead electrodes via gold wires.
Figure 8:
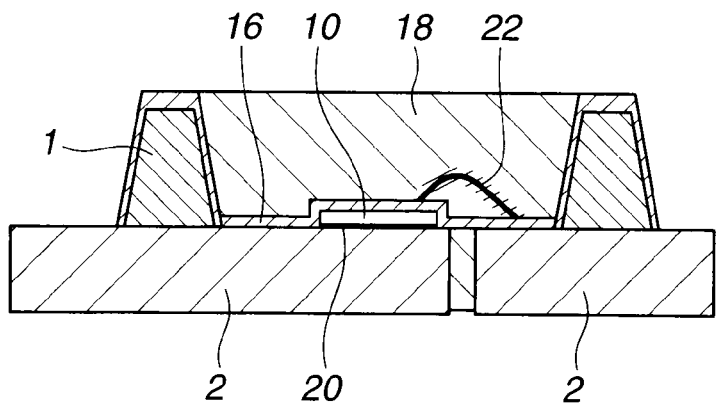
FIG. 8 is a cross-sectional view of a light-emitting semiconductor device according to a fifth embodiment of the present invention, in which a transparent molding material has been cast and cured in a recessed part of a reflector.

Perhydropolysilazane or its solution is coated on surfaces of the light-emitting semiconductor chip 10, gold wires 22 and reflector 1 of the light-emitting semiconductor device of FIG. 6, and is then cured to form a cured silicon oxide film 16, thereby fabricating the light-emitting semiconductor device according to the fourth embodiment of the present invention (FIG. 7). If necessary, a transparent resin or phosphor-containing transparent resin 18 may be cast into the recessed part of the reflector 1 shown in FIG. 7, and may then be cured to fabricate the light-emitting semiconductor device according to the fifth embodiment of the present invention (FIG. 8).

Further, a cured silicon oxide film can also be formed with perhydropolysilazane or its solution to fabricate a mounted substrate according to the present invention even in a state that one or more light-emitting semiconductor devices are mounted on a mounting substrate. One example of the mounted substrate is shown in FIG. 9.

Although not shown in FIG. 9, a mounted substrate may be fabricated as in FIG. 5. In the state of FIG. 6, the light-emitting semiconductor chip and gold wires may be encapsulated with a transparent resin or phosphor-containing transparent resin, and a cured silicon oxide film may then be formed over surfaces of the transparent resin and reflector.

In the illustrative mounted substrate shown in FIG. 9, a plurality of light-emitting semiconductor devices are mounted on a mounting substrate 30. In this example, each light-emitting semiconductor device is fabricated by casting a transparent resin 18 into the recessed part of the light-emitting semiconductor device shown in FIG. 2 and then curing the transparent resin 18. The plurality of light-emitting semiconductor devices fabricated as described above are mounted with a solder 32 on the mounting substrate 30 such as an organic substrate or ceramic substrate. Subsequently, over the mounting substrate 30 with the plurality of light-emitting semiconductor devices mounted thereon, perhydropolysilazane or its solution is evenly applied by spray coating or the like and is then cured. Subsequent to the curing as described above, a cured silicon oxide film 16 is formed over surfaces of the substrate and light-emitting semiconductor devices. In this manner, it is possible to easily fabricate a substrate with one or more light-emitting semiconductor devices mounted thereon.

It is to be noted that a mounted substrate can be fabricated in a similar manner as in FIG. 9 by using, as light-emitting semiconductor devices, those similar to the one of FIG. 6 instead of those similar to the one of FIG. 2.

Perhydropolysilazane useful in the present invention is obtained by reacting dichlorosilane and ammonia gas as raw materials, and has a structure represented by

(n: positive integer).

More specifically, perhydropolysilazane can be represented by the following structure.

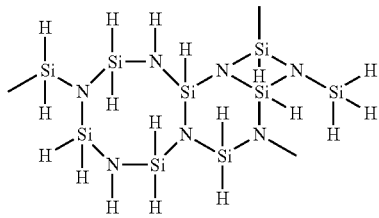

The polymerization degree and molecular weight of perhydropolysilazane can be selectively determined as desired. However, a weight average molecular weight by gel permeation chromatography (GPC) relative to polystyrene standards may preferably be 100 to 30,000.

As perhydropolysilazane, a commercial product can be used. For example, "AQUAMICA" (trademark, product of AZ Electronic Materials (Japan) K.K.) can be used.

Perhydropolysilazane may be used preferably as a mixture with an organic solvent or silicone-based solvent which has been previously subjected to drying treatment. The concentration of the perhydropolysilazane varies depending on the thickness of a film to be formed. Preferably, its concentration may be set at 0.1 to 30 wt %. To form a cured silicon oxide film of 0.05 to 10 μm thickness, it is desired to use a mixture or solution that contains perhydropolysilazane at a concentration of 0.1 to 30 wt %.

Usable solvents may be polar solvents, for example, ethers, ketones, cyclic siloxanes such as tetramethyldisiloxane and octamethyltetracyclosiloxane, and the like. Among these solvents, dibutyl ether and tetrabutyl ether are desired.

With respect to a coating method, it is preferred to apply a perhydropolysilazane solution onto a light-emitting semiconductor device by a brush or spray gun or by a casting method. Owing to the use of perhydropolysilazane as a raw material, no much contraction stress is produced during curing as opposed to the formation of a silicon-containing film from a conventional silane coupling agent or tetramethoxysilane, and therefore, a good film can be obtained without cracks. Further, the use of perhydropolysilazane makes it possible to obtain a durable film which has strong adhesion to a silicone resin as a cured transparent resin, the surface of a light-emitting semiconductor chip, and the surface of a reflector, and which, as a cured film, has significant hardness as high as 8H or still higher in terms of pencil hardness.

With respect to a curing method of perhydropolysilazane, perhydropolysilazane can be cured, for example, by reacting it with moisture in air as indicated by the below-described reaction formula or by heating it at 150 to 250° C. By such a curing method, a cured thin film of silicon oxide can be easily formed with high quality.

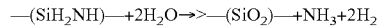

As to the transparent resin used as an encapsulating resin, a silicone resin or a composite resin of a silicone resin and an organic resin can be exemplified.

A condensation curable or addition curable thermosetting silicone resin composition can be exemplified as the silicone resin.

As to the condensation curable silicone resin composition, it is preferred to use a known condensation curable silicone resin composition comprising a silicone resin (organopolysiloxane) represented by the following average compositional formula (1):

(1)

wherein $R^1$ is identical or different, an organic group such as a monovalent hydrocarbon group having 1 to 20 carbon atoms and $R^2$ is an organic group such as a monovalent hydrocarbon group having 1 to 4 carbon atoms, and a, b and c stand for numerical values that satisfy the following equations: $0.8 \leq a \leq 1.5$, $0 \leq b \leq 0.3$, $0.001 \leq c \leq 0.5$ and $0.801 \leq a+b+c<2$, and a condensation catalyst added therein.

The addition curable silicone resin composition it may comprise a vinyl group-containing silicone resin (vinyl group-containing organopolysiloxane), a hydrosilyl group-containing silicone resin (organohydrogenpolysiloxane) as a curing agent, and a platinum catalyst.

As to the composite resin, a thermosetting epoxy-silicone resin composition comprising a triazine derivative epoxy resin, a silicone resin, an acid anhydride and a curing promoter is desired for its good curability, excellent heat resistance and light resistance, and good strength. To obtain moldability and to provide the resulting cured product with good physical properties, the present invention can also use a resin obtained by subjecting an epoxy resin and/or a silicone resin containing at least one epoxy group in a molecule, and an acid anhydride to a preliminary reaction such that the polymerization degree is increased.

From the standpoints of heat resistance, light resistance and strength, the weight ratio of the silicone resin to the organic resin such as the epoxy resin may desirably be in a range of from 20/80 to 80/20.

In the transparent resin for use in the present invention, an inorganic filler can be incorporated in addition to a phosphor to be described later. Examples of the inorganic filler include fused silica powder, crystalline silica powder, finely divided silica such as aerosil, finely divided alumina, spherical fused silica or cristobalite, alumina powder, glass powder, and so on. These powders may have an average particle size of about 2 to about 10 µm. Finely divided silica or finely divided alumina may preferably be used at 1 to 10 wt % in the composition to avoid the settling of a phosphor or the like. A light-scattering material such as finely divided titanium oxide can also be added. It is to be noted that the average particle size can be determined as a weight average value (median diameter), for example, by a particle size distribution analyzer making use of an analysis method such as laser beam diffractometry.

To the resin composition for use in the present invention, a phosphor can also be added to alter the wavelength. When desired to use a blue LED and to convert its emission into light of a white color, for example, a powder of one or more of various phosphors known to date can be added. It is particularly advantageous to contain particles of a phosphor selected, as a yellow phosphor, from the group consisting of garnets represented by the formula $A_3B_5O_{12}$:M wherein the component A includes at least one element selected from the group consisting of Y, Gd, Tb, La, Lu, Se and Sm, the component B includes at least one element selected from the group consisting of Al, Ga and In, and the component M includes at least one element selected from the group consisting of Ce, Pr, Eu, Nd and Er. As a phosphor for a light-emitting diode device provided with a light-emitting diode chip, which radiates blue light, and capable of radiating white light, $Y_3Al_5O_{12}$:Ce phosphor and/or $(Y,Gd,Tb)_3(Al, Ga)_5O_{12}$:Ce phosphor is suited. Other phosphors include, for example, $CaGa_2S_4$:$Ce^{3+}$, $SrGa_2S_4$:$Ce^{3+}$, $YAlO_3$:$Ce^{3+}$, $YGaO_3$:$Ce^{3+}$, $Y(Al, Ga)O_3$:$Ce^{3+}$, $Y_2SiO_5$:$Ce^{3+}$, and the like. For the production of light of a mixed color, aluminate salts doped with rare-earth elements, orthosilicate salts doped with rare-earth elements, and the like are suited in addition to the above-described phosphors. When desired to use the above-described resin composition as a molding resin for a blue light-emitting diode (LED) to convert its emission into white light, a phosphor such as a yttrium-aluminum-garnet (YAG) system, a nitride silicate, or a thiogallate doped with a rare earth element may be incorporated in the resin composition. Although no limitation is imposed on the content of the phosphor, the phosphor may be contained desirably in a range of from 1 to 30 wt %, particularly desirably in a range of from 5 to 20 wt % in the composition.

A light-emitting semiconductor device having a cured silicon oxide film of 0.05 to 10 µm thickness formed by curing perhydropolysilazane as described above can inhibit the transmission of corrosive gas such as $SO_x$ and $NO_x$, and therefore, can inhibit the formation of silver sulfide at the silver-plated part of a reflector and can avoid a reduction in brightness.

Further, the cured product of a silicone resin has surface tackiness, and therefore, is accompanied by problems such that dust may adhere and light-emitting semiconductor devices themselves may stick together. However, light-emitting semiconductor devices, which are provided on surfaces thereof with a cured silicon oxide film formed by using perhydropolysilazane useful in the present invention, are free of this sort of inconvenience.

EXAMPLES

The present invention will hereinafter be described in detail based on Examples, Comparative Example and tests, although the present invention shall by no means be limited to or by the following Examples.

Example 1

On a reflector molded with a thermosetting silicone resin composition ("SWC7200T," trade name, product of Shin-Etsu Chemical Co., Ltd.) and having the structure of FIGS. 1A and 1B, a blue LED was held in place with a silicone-based die bonding material ("KJR-632DA-1," trade name, product of Shin-Etsu Chemical Co., Ltd.). By heating at 150° C. for one hour, the blue LED was fixed on a die pad.

Subsequently, the blue LED and lead electrodes were electrically connected together via gold wires (FIG. 6). A silicone resin composition, which had been prepared by adding a YAG phosphor at 5 wt % to a transparent silicone resin composition ("LPS-3410," trade name, product of Shin-Etsu Chemical Co., Ltd.), was then poured into-a recessed part of the reflector by potting. The silicone resin composition was heated and cured at 120° C. for one hour and further at 150° C. for two hours to encapsulate the blue LED.

The resulting light-emitting semiconductor device was spray-coated with a 25 wt % solution of perhydropolysilazane ("AQUAMICA," trademark, product of AZ Electronic Materials (Japan) K.K.) in tetrabutyl ether. After the coating, the light-emitting semiconductor device was heated at 200° C. for 20 minutes to cure the perhydropolysilazane such that a crack-free, transparent, cured silicon oxide film was formed. The film thickness was approx. 1 µm. Plural light-emitting semiconductor devices were fabricated as described above, and were provided as Light-emitting semiconductor devices No. 1.

Comparative Example 1

Plural light-emitting semiconductor devices were fabricated in a similar manner as in Example 1 except that they were not treated with perhydropolysilazane, and were provided as Light-emitting semiconductor devices No. 2.

Example 2

On a reflector molded from the thermosetting silicone resin composition ("SWC7200T," trade name, product of Shin-Etsu Chemical Co., Ltd.) and having the structure of FIGS. 1A and 1B, a blue LED was connected via gold bumps as shown in FIG. 2. After the connection, the transparent silicone resin composition ("LPS-3410," trade name, product of Shin-Etsu Chemical Co., Ltd.), which contained 50 wt % of spherical silica of 5 µm in average particle size, was poured into a gap between the blue LED and a lead frame, and was then cured at 120° C. for one hour. After the silicone resin composition had cured, a 25 wt % solution of perhydropolysilazane ("AQUAMICA") in tetrabutyl ether was poured into a recessed part of the reflector, followed by curing at 180° C. for 30 minutes. Subsequently, the perhydropolysilazane solution was poured again, and perhydropolysilazane was cured at 180° C. for one hour such that a crack-free, transparent, cured silicon oxide film was formed with an average film thickness of approx. 2 μm (FIG. 3). The resulting light-emitting semiconductor device was provided as Light-emitting semiconductor device No. 3.

Example 3

Using a light-emitting semiconductor device fabricated in a similar manner as Light-emitting semiconductor device No. 3, the same addition curable silicone resin composition as in Example 1 was poured into a recessed part of a reflector by potting, and was then heated and cured at 120° C. for one hour and further at 150° C. for two hours to encapsulate the light-emitting semiconductor device (FIG. 4). The resulting light-emitting semiconductor device was provided as Light-emitting semiconductor device No. 4.

Example 4

After a blue LED was bonded on a lead frame by the flip-chip bonding method (FIG. 2), the same addition curable silicone resin composition as in Example 1 was poured into a recessed part of a reflector by potting, and was then heated and cured at 120° C. for one hour and further at 150° C. for two hours to mold the blue LED.

The resulting light-emitting semiconductor device was spray-coated with a 25 wt % solution of perhydropolysilazane ("AQUAMICA") in tetrabutyl ether. After the coating, the light-emitting semiconductor device was heated at 200° C. for 20 minutes to cure the perhydropolysilazane such that a crack-free, transparent, cured silicon oxide film was formed (FIG. 5). The film thickness was approx. 1 μm. The light-emitting semiconductor device so fabricated was provided as Light-emitting semiconductor device No. 5.

Example 5

After a blue LED was bonded on a lead frame by the flip-chip bonding method (FIG. 2), the same addition curable silicone resin composition as in Example 1 was poured into a recessed part of a reflector by potting, and was then heated and cured at 120° C. for one hour and further at 150° C. for two hours to mold the blue LED.

Three light-emitting semiconductor devices obtained in a similar manner as described above were fixed with solder on a ceramic-made, mounting substrate such that electrodes of the reflectors and those of the mounting substrate were connected together. Subsequently, a 25 wt % solution of perhydropolysilazane ("AQUAMICA") in tetrabutyl ether was spray-coated. After the coating, the light-emitting semiconductor devices were heated at 200° C. for 20 minutes to cure the perhydropolysilazane such that a crack-free, transparent, cured silicon oxide film was formed (FIG. 9). The film thickness was approx. 1 μm. The resulting mounted substrate was provided as Light-emitting semiconductor devices No. 6.

Test 1
Tackiness Test

Using Light-emitting semiconductor devices No. 1 and No. 2 of Example 1 and Comparative Example 1, their silicone resin surfaces were compared in tackiness. As an evaluation method, aluminum powder (5 g) of 1 μm in particle size was sprinkled over each light-emitting semiconductor device, and the tackiness of each light-emitting semiconductor device was evaluated depending on the degree of adhesion of the aluminum powder on the silicone resin surface.

The aluminum powder did not adhere at all to Light-emitting semiconductor device No. 1 with the cured silicon oxide film being formed with perhydropolysilazane ("AQUAMICA") on its surface, while the aluminum powder adhered to the whole surface of Light-emitting semiconductor device No. 2.

Test 2
Anti-sulfidation Test

In a hermetically-sealable glass vessel (30 cm×10 cm×15 cm), the light-emitting semiconductor devices fabricated in Examples 1 to 5 and Comparative Example 1 were placed together with ammonium sulfide (40 g) and water (40 g). Those light-emitting semiconductor devices were left over at room temperature for 48 hours, and were then observed for discoloration at silver-plated surfaces.

Light-emitting semiconductor devices No. 1, No. 3, No. 4, No. 5 and No. 6 fabricated in Examples 1 to 5 were all free from discoloration at all at the silver-plated surfaces, while Light-emitting semiconductor device No. 2 discolored into a black color.

Japanese Patent Application No. 2010-155362 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A light-emitting semiconductor device comprising a lead frame having lead electrodes, a reflector arranged with the lead frame, and a light-emitting semiconductor chip accommodated in the reflector and having electrodes connected to the lead electrodes by a flip-chip bonding method, wherein:
a gap between the lead frame and the light-emitting semiconductor chip is filled with a cured underfill material, and
a cured silicon oxide film of 0.05 to 10 μm thickness is formed covering surfaces of the light-emitting semiconductor chip and reflector.

2. The light-emitting semiconductor device according to claim 1, wherein the light-emitting semiconductor chip is encapsulated in a transparent resin or a phosphor-containing transparent resin.

3. The light-emitting semiconductor device according to claim 1, wherein the cured silicon oxide film has been formed by curing perhydropolysilazane.

4. The light-emitting semiconductor device according to claim 2, wherein the transparent resin contains at least 30 wt % of a silicone resin.

5. The light-emitting semiconductor device according to claim 4, wherein the transparent resin is a cured product of a thermosetting epoxy-silicone resin composition.

6. A light-emitting semiconductor device comprising a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires, wherein:
a cured silicon oxide film of 0.05 to 10 μm thickness is formed covering surfaces of the light-emitting semiconductor chip, thin conductive wires and reflector.

7. The light-emitting semiconductor device according to claim 6, wherein the light-emitting semiconductor chip is encapsulated in a transparent resin or a phosphor-containing transparent resin.

8. A light-emitting semiconductor device comprising a lead frame having lead electrodes, a reflector arranged with the lead frame, and a light-emitting semiconductor chip accommodated in the reflector and having electrodes connected to the lead electrodes by a flip-chip bonding method, wherein:
- a gap between the lead frame and the light-emitting semiconductor chip is filled up with a cured underfill material,
- the light-emitting semiconductor chip is encapsulated in a transparent resin or a phosphor-containing transparent resin, and
- a cured silicon oxide film of 0.05 to 10 μm thickness is formed covering surfaces of the transparent resin and reflector.

9. A light-emitting semiconductor device comprising a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires, wherein:
- the light-emitting semiconductor chip and thin conductive wires are encapsulated in a transparent resin or a phosphor-containing transparent resin, and
- a cured silicon oxide film of 0.05 to 10 μm thickness is formed covering surfaces of the transparent resin and reflector.

10. A mounted substrate comprising a mounting substrate and a light-emitting semiconductor device mounted on the mounting substrate, said light-emitting semiconductor device being provided with a lead frame having lead electrodes, a reflector arranged with the lead frame, and a light-emitting semiconductor chip accommodated in the reflector and having electrodes connected to the lead electrodes by a flip-chip bonding method, and said light-emitting semiconductor device having been mounted on the mounting substrate by bonding the lead electrodes to the mounting substrate with a conductive bonding material, wherein:
- a gap between the lead frame and the light-emitting semiconductor chip is filled up with a cured underfill material,
- the light-emitting semiconductor chip is encapsulated in a transparent resin or a phosphor-containing transparent resin, and a cured silicon oxide film of 0.05 to 10 μm thickness is formed over a surface of the light-emitting semiconductor device on the mounting substrate.

11. The mounted substrate according to claim 10, wherein the transparent resin contains at least 30 wt % of a silicone resin.

12. The mounted substrate according to claim 10, wherein the cured silicon oxide film has been formed by curing perhydropolysilazane.

13. The mounted substrate according to claim 11, wherein the transparent resin is a cured product of a thermosetting epoxy-silicone resin composition.

14. A mounted substrate comprising a mounting substrate and a light-emitting semiconductor device mounted on the mounting substrate, said light-emitting semiconductor device being provided with a lead frame having a die pad and lead electrodes, a reflector arranged with the lead frame, and a light-emitting semiconductor chip accommodated in the reflector, fixed on the die pad with a die bonding material and having electrodes connected to the lead electrodes via thin conductive wires, and said light-emitting semiconductor device having been mounted on the mounting substrate by bonding the lead electrodes to the mounting substrate with a conductive bonding material, wherein:
- the light-emitting semiconductor chip and thin conductive wires are encapsulated in a transparent resin or a phosphor-containing transparent resin, and
- a cured silicon oxide film of 0.05 to 10 μm thickness is formed over a surface of the light-emitting semiconductor device on the mounting substrate.

15. A fabrication method of a light-emitting semiconductor device provided with a lead frame having lead electrodes, a reflector arranged with the lead frame, and a light-emitting semiconductor chip having electrodes and accommodated in the reflector, which comprises:
- connecting the electrodes of the light-emitting semiconductor chip to the lead electrodes by a flip-chip bonding method,
- filling a gap between the lead frame and the light-emitting semiconductor chip with an underfill material, and then curing the underfill material, and then,
- spray- or cast-coating a solution of perhydropolysilazane to cover surfaces of the light-emitting semiconductor chip and reflector, and then curing the perhydropolysilazane to form a cured silicon oxide film of 0.05 to 10 μm thickness.

16. The fabrication method according to claim 15, further comprising:
- encapsulating the light-emitting semiconductor chip with a transparent resin or a phosphor-containing transparent resin.

17. The fabrication method according to claim 16, wherein the transparent resin contains at least 30 wt % of a silicone resin.

18. The fabrication method according to claim 17, wherein the transparent resin is a cured product of a thermosetting epoxy-silicone resin composition.

19. A fabrication method of a light-emitting semiconductor device provided with a lead frame having a die pad and lead electrodes, a reflector arranged with the lead frame, and a light-emitting semiconductor chip having electrodes, accommodated in the reflector and fixed on the die pad with a die bonding material, which comprises:
- connecting the electrodes of the light-emitting semiconductor chip and the lead electrodes together via thin conductive wires, and then,
- spray- or cast-coating a solution of perhydropolysilazane to cover surfaces of the light-emitting semiconductor chip, thin conductive wires and reflector, and then curing the perhydropolysilazane to form a cured silicon oxide film of 0.05 to 10 μm thickness.

20. The fabrication method according to claim 19, further comprising:
- encapsulating the light-emitting semiconductor chip with a transparent resin or a phosphor-containing transparent resin.

21. A fabrication method of a light-emitting semiconductor device provided with a lead frame having lead electrodes, a reflector arranged with the lead frame, and a light-emitting semiconductor chip having electrodes and accommodated in the reflector, which comprises:
- connecting the electrodes of the light-emitting semiconductor chip to the lead electrodes by a flip-chip bonding method,
- filling a gap between the lead frame and the light-emitting semiconductor chip with an underfill material, and then curing the underfill material, encapsulating the light-emitting semiconductor chip with a transparent resin or a phosphor-containing transparent resin, and then, spray- or cast-coating a solution of perhydropolysilazane to cover surfaces of the transparent resin and reflector, and then curing the perhydropolysilazane to form a cured silicon oxide film of 0.05 to 10 μm thickness.

22. A fabrication method of a light-emitting semiconductor device provided with a lead frame having a die pad and lead electrodes, a reflector arranged with the lead frame, and a light-emitting semiconductor chip having electrodes, accommodated in the reflector and fixed on the die pad with a die bonding material, which comprises:

connecting the electrodes of the light-emitting semiconductor chip and the lead electrodes together via thin conductive wires, encapsulating the light-emitting semiconductor chip and thin conductive wires with a transparent resin or a phosphor-containing transparent resin, and then, spray- or cast-coating a solution of perhydropolysilazane to cover surfaces of the transparent resin and reflector, and then curing the perhydropolysilazane to form a cured silicon oxide film of 0.05 to 10 μm thickness.

23. A fabrication method of a mounted substrate including a mounting substrate and a light-emitting semiconductor device mounted on the mounting substrate and provided with a lead frame having lead electrodes, a reflector arranged with the lead frame, and a light-emitting semiconductor chip having electrodes and accommodated in the reflector, which comprises:

connecting the electrodes of the light-emitting semiconductor chip to the lead electrodes by a flip-chip bonding method, filling a gap between the lead frame and the light-emitting semiconductor chip with an underfill material, and then curing the underfill material, encapsulating the light-emitting semiconductor chip with a transparent resin or a phosphor-containing transparent resin, bonding the lead electrodes to the mounting substrate with a conductive bonding material to mount the light emitting semiconductor device on the mounting substrate, and then, spray- or cast-coating a solution of perhydropolysilazane to cover a surface of the light-emitting semiconductor device on the mounting substrate, and then curing the perhydropolysilazane to form a cured silicon oxide film of 0.05 to 10 μm thickness.

24. The fabrication method according to claim 23, wherein the transparent resin contains at least 30 wt % of a silicone resin.

25. The fabrication method according to claim 24, wherein the transparent resin is a cured product of a thermosetting epoxy-silicone resin composition.

26. A fabrication method of a mounted substrate including a mounting substrate and a light-emitting semiconductor device mounted on the mounting substrate and provided with a lead frame having a die pad and lead electrodes, a reflector arranged with the lead frame, and a light-emitting semiconductor chip having electrodes, accommodated in the reflector and fixed on the die pad with a die bonding material, which comprises:

connecting the electrodes of the light-emitting semiconductor chip and the lead electrodes together via thin conductive wires, encapsulating the light-emitting semiconductor chip and thin conductive wires with a transparent resin or a phosphor-containing transparent resin, bonding the lead electrodes to the mounting substrate with a conductive bonding material to mount the light emitting semiconductor device on the mounting substrate, and then, spray- or cast-coating a solution of perhydropolysilazane to cover a surface of the light-emitting semiconductor device on the mounting substrate, and then curing the perhydropolysilazane to form a cured silicon oxide film of 0.05 to 10 μm thickness.

\* \* \* \* \*